US011711066B2

United States Patent
Lebedev (10) Patent No.: US 11,711,066 B2
(45) Date of Patent: Jul. 25, 2023

(54) ELECTROACOUSTIC RESONATOR AND METHOD FOR MANUFACTURING THE SAME

(71) Applicant: Fraunhofer Gesellschaft Zur Förderung Der Angewandten Forschung E.V., Munich (DE)

(72) Inventor: Vadim Lebedev, Emmendingen (DE)

(73) Assignee: Fraunhofer-Gesellschaft zur Forderung der angewandten Forschung e.V., Munich (DE)

( * ) Notice: Subject to any disclaimer, the term of this patent is extended or adjusted under 35 U.S.C. 154(b) by 925 days.

(21) Appl. No.: 16/655,304

(22) Filed: Oct. 17, 2019

(65) Prior Publication Data
US 2020/0127640 A1   Apr. 23, 2020

(30) Foreign Application Priority Data
Oct. 18, 2018   (DE) ..................... 10 2018 217 892.5

(51) Int. Cl.
*H03H 9/17*   (2006.01)
*H03H 9/05*   (2006.01)
(Continued)

(52) U.S. Cl.
CPC .............. *H03H 9/17* (2013.01); *C23C 28/04* (2013.01); *H03H 3/007* (2013.01); *H03H 9/05* (2013.01);
(Continued)

(58) Field of Classification Search
CPC .. H03H 9/17; H03H 9/13; H03H 9/05; H03H 9/02732; H03H 9/02724; H03H 9/02637;
(Continued)

(56) References Cited

U.S. PATENT DOCUMENTS

| 5,576,589 A | 11/1996 | Dreifus et al. |
| 5,652,436 A | 7/1997 | Stoner et al. |
| (Continued) | | |

FOREIGN PATENT DOCUMENTS

| JP | 2015000617 A | 1/2015 |
| JP | 2015119310 A | 6/2015 |
| JP | 2015119370 A | 6/2015 |

OTHER PUBLICATIONS

Vadim Lebedev, et al.; "Formation of icosahedron twins during initial stages of heteroepitaxial diamond nucleation and growth"; Journal of Applied Physics 125, 075305 (2019); https://doi.org/10.1063/1.5085184; scitation.org/jounal/iap; Published Online: Feb. 20, 2019; 11 pgs.

(Continued)

*Primary Examiner* — J. San Martin
(74) *Attorney, Agent, or Firm* — Alix, Yale & Ristas, LLP (57) ABSTRACT

The invention relates to a method for manufacturing an electroacoustic resonator comprising the steps of: Providing a first substrate having a first side and an opposite second side; depositing a diamond layer having a first side and an opposite second side on said first substrate, wherein the second side of the diamond layer is in contact with said first side of the first substrate; removing the first substrate; forming a piezoelectric layer on the second side of the diamond layer; applying a second substrate to the first side of the diamond layer.

21 Claims, 4 Drawing Sheets

(51) Int. Cl.
  *H03H 3/007* (2006.01)
  *C23C 28/04* (2006.01)
  *H03H 9/13* (2006.01)
  *H10N 30/074* (2023.01)
  *H10N 30/00* (2023.01)
  *C23C 16/01* (2006.01)
  *C23C 16/27* (2006.01)

(52) U.S. Cl.
  CPC ............ *H03H 9/13* (2013.01); *H10N 30/074* (2023.02); *H10N 30/1051* (2023.02); *C23C 16/01* (2013.01); *C23C 16/27* (2013.01)

(58) Field of Classification Search
  CPC  H03H 9/02582; H03H 3/007; H01L 41/0805; H01L 41/314
  See application file for complete search history.

(56) References Cited

U.S. PATENT DOCUMENTS

| | | | |
|---|---|---|---|
| 5,838,090 | A * | 11/1998 | Nakahata ........... H03H 9/02582 |
| | | | 310/313 A |
| 6,858,969 | B2 | 2/2005 | Bi et al. |
| 7,230,509 | B2 | 6/2007 | Stoemmer |
| 9,431,996 | B2 | 8/2016 | Watanabe et al. |
| 9,484,885 | B2 | 11/2016 | Watanabe et al. |
| 9,831,848 | B2 | 11/2017 | Watanabe et al. |
| 2004/0031438 | A1 | 2/2004 | Sung |
| 2013/0285768 | A1 | 10/2013 | Watanabe et al. |
| 2017/0331449 | A1 | 11/2017 | Watanabe et al. |

OTHER PUBLICATIONS

Taro Yoshikawa, et al.; "Influence of substrate holder configurations on bias enhanced nucleation area for diamond heterepitaxy: Toward wafer-scale single-crystalline diamond synthesis"; Journal of Vacuum Science & Technology B 37, 021207 (2019); doi: 10.1116/1.5086020; https://doi.org/10.1116/1.5086020; Published by the American Vacuum Society; 9 pgs.

Assouar, M.B. et al., "High-frequency surface acoustic wave devices based on AlN/diamond layered structure realized using e-beam lithography," Journal of Applied Physics 101, 114507 (2007).

Benetti, M. et al., "SAW Sensors on Aln/Diamond/Si Structures," Sensors, 753-756, vol. 2, IEEE 2004.

Braun, L. et al., "High Frequency-Low Loss SAW Resonators Built on NanoCrystalline Diamond-Based Substrate," 2014 European Frequency and Time Forum (EFTF), 262-265, IEEE 2014.

Dow, Ali B. Alamin et al., "15 GHz SAW Nano-Transducers Using Ultrananocrystalline Diamond/AlN Thin Films," 2012 IEEE International Ultrasonics Symposium, 968-971, IEEE 2012.

Fujii, Satoshi et al., "Fabrication of SAW resonators on single-crystal diamonds using Minimal-Fab process," 2017 IEEE International Ultrasonics Symposium (IUS), 1-3, IEEE 2017.

Fujii, Satoshi et al., "Low Propagation Loss in a One-Port SAW Resonator Fabricated on Single-Crystal Diamond for Super-High-Frequency Applications," IEEE Transactions on Ultrasonics, Ferroelectrics, and Frequency Control, vol. 60, No. 5, May 2013.

Kirsch, P. et al., "5 GHz surface acoustic wave devices based on aluminum nitride/diamond layered structure realized using electron beam lithography," Appl. Phys. Lett. 88, 223504 (2006).

Lebedev, V. et al., "Nanodiamond resonators fabricated on 8" Si substrates using adhesive wafer bonding," J. Micromech. Microeng. 27, 065011 (2017).

Mortet, V. et al., "Diamond: a material for acoustic devices," phys. stat. sol. (a) 205, No. 5, 1009-1020 (2008).

Zhou, Changjian et al., "Surface acoustic wave characteristics based on c-axis (006) LiNbO3/diamond/silicon layered structure," Appl. Phys. Lett. 99, 022109 (2011).

Zou, Jie et al., "Transducer design for AlN Lamb wave resonators," Journal of Applied Physics 121, 154502 (2017).

* cited by examiner

ELECTROACOUSTIC RESONATOR AND METHOD FOR MANUFACTURING THE SAME

RELATED APPLICATIONS

This application claims priority to German Patent Application Serial No. 10 2018 217 892.5 filed on Oct. 18, 2018. The subject matter disclosed in that application is hereby expressly incorporated into the present application in its entirety.

FIELD OF THE DISCLOSURE

The invention relates to an electroacoustic resonator having a diamond layer with a first side and an opposite second side and a piezoelectric layer arranged on the second side of the diamond layer. Electroacoustic resonators of this type can be used in high-frequency filters or electroacoustic sensors. The invention also relates to methods for manufacturing such an electroacoustic resonator.

BACKGROUND

P. Kirsch et al.: "5 GHz surface acoustic wave devices based on aluminum nitride/diamond layered structure realized using electron beam lithography". Appl. Phys. Lett. 88 (2006) 223504, discloses providing a heteroepitaxially deposited diamond layer covered by a piezoelectric layer. Surface acoustic waves can be generated in the diamond by applying an alternating electric field to this piezoelectric layer. Thus, the diamond layer may be used as a surface acoustic wave filter.

Due to the constantly increasing carrier frequencies and data rates of wireless data transmission systems, there is a need for electronic filters having an increased operating frequency and improved Q-factor over known surface acoustic wave filters. Therefore, it is an object of the present invention to provide an electronic filter having an increased operating frequency and improved Q-factor.

SUMMARY

In some embodiments, the invention relates to a method for manufacturing an electroacoustic resonator comprising the steps of: Providing a first substrate having a first side and an opposite second side; depositing a diamond layer having a first side and an opposite second side on said first substrate, wherein the second side of the diamond layer is in contact with said first side of the first substrate; removing the first substrate; forming a piezoelectric layer on the second side of the diamond layer; applying a second substrate to the first side of the diamond layer.

In another embodiment, the invention relates to a method for manufacturing an electroacoustic resonator comprising the steps of: Providing a first substrate having a first side and an opposite second side; depositing a piezoelectric layer having a first side and an opposite second side on the first side of said first substrate, such that the second side of said piezoelectric layer is in contact with said first side of the first substrate; depositing a diamond layer having a first side and an opposite second side on the first side of said piezoelectric layer, such that the second side of said diamond layer is in contact with said first side of the piezoelectric layer; applying a second substrate having a first side and an opposite second side on the first side of the diamond layer such that the second side of said second substrate is in contact with said first side of the diamond layer; completely removing the first substrate.

In still another embodiment, the invention relates to an electroacoustic resonator comprising a diamond layer having a first side and an opposite second side and a piezoelectric layer having a first side and an opposite second side, wherein the second side of said diamond layer is in contact with said first side of the piezoelectric layer, a second substrate having a first side and an opposite second side, wherein the second side of said second substrate is in contact with said first side of said diamond layer.

BRIEF DESCRIPTION OF THE DRAWINGS

The invention shall be explained in more detail below by means of embodiments without limiting the general concept of the invention, wherein.

DETAILED DESCRIPTION

The invention relates to an electroacoustic resonator and methods for its manufacturing. The electroacoustic resonator comprises a diamond layer having a first side and an opposite second side. In some embodiments, this diamond layer may be deposited heteroepitaxially from a gas phase comprising at least one hydrocarbon in a low-pressure synthesis such as a microwave-driven or hot filament-promoted CVD-process. The step of diamond growth may be performed by putting a first substrate into a vacuum chamber which is evacuated and subsequently flooded with a precursor gas substantially comprising hydrogen. Additionally, the precursor gas comprises at least one carbon-based gas, such as a hydrocarbon, e.g. methane or acetylene. In some embodiments, the precursor gas may comprise further at least one dopant. The gas phase may be activated by microwave radiation or hot filaments made of refractory metals, so that $sp^3$-hybridized carbon in diamond structure is deposited on the first substrate. Such deposition methods are known in many variations which may be usable for carrying out the invention. The invention does not teach the use of a specific deposition method of the diamond layer.

In some embodiments of the invention, the first substrate may be selected from the group comprising silicon, molybdenum, strontium titanate, aluminum nitrite, zinc oxide, nickel, platinum, iridium, or diamond. In some embodiments, the first substrate may comprise monocrystalline material. The first substrate has a first side and an opposite second side and edge surfaces. During low-pressure synthesis, a diamond layer is deposited on the first side of the first substrate. Thus, this diamond layer also has a first side facing the gas phase and an opposite second side, the second side being in contact with the first side of the first substrate. The diamond layer may have a thickness of about 1 μm to about 30 μm or of about 2 μm to about 20 μm or of about 2 μm to about 10 μm or of about 3 μm to about 8 μm or of about 8 μm to about 25 μm or of about 10 μm to about 30

µm. In the present description, the word "about" means that the stated value can vary within a range of +/−5%.

In some embodiments of the invention, the first substrate may be removed after manufacturing the diamond layer. As a result, the second side of the diamond layer is exposed so that a piezoelectric layer, i.e. a layer of piezoelectric material, can be deposited heteroepitaxially in at least a partial area of the second side of the diamond layer. Deposition of said piezoelectric layer may be done by molecular beam epitaxy (MBE), metal-organic chemical vapor deposition (MOCVD), metal-organic vapor phase epitaxy (MOVPE), vaporization, sputtering or similar methods allowing thin film deposition. If the first substrate itself comprises a piezoelectric material or is coated with a piezoelectric material, the second side of the diamond layer may be grown directly on the piezoelectric layer. In these embodiments, complete removal of the first substrate may not be necessary. It may suffice to merely thin but not completely remove the first substrate.

In some embodiments, the first side of the diamond layer is fixed to a second substrate. In some embodiments of the invention, the diamond layer and the second substrate may be joined by a wafer bonding process. In some embodiments of the invention, the second substrate may comprise any of silicon, a metal or an alloy. In other embodiments of the invention, the second substrate may comprise a ceramic material, such as aluminum oxide, silicon oxide, a nitride or an oxynitride.

In some embodiments of the invention, the second substrate has an acoustic impedance which is lower than the acoustic impedance of diamond by a factor of 5, a factor of 10, a factor of 20 or a factor of 30. For the purposes of the present description, acoustic impedance denotes the product of material density and sound velocity within the material.

In some embodiments of the invention, acoustic energy is reflected at least partly at the interface between the second side of the diamond layer and the adjoining material, so that the acoustic energy is at least partly confined inside the diamond layer. This may lead to the low-loss propagation of surface waves and Lamb waves, so that the Q-factor and/or the operating frequency may increase. The greater the difference between the acoustic impedances of the diamond layer, on the one hand, and the adjoining material, on the other hand, the greater is the reflected part of the acoustic energy and the stronger is the confinement.

In some embodiments of the invention, the ratio of the acoustic impedances of the piezoelectric layer and the diamond layer is less than about 4. In some embodiments of the invention, the ratio of the acoustic impedance of the piezoelectric layer to the acoustic impedance of the diamond layer is less than about 3. In some embodiments of the invention, the ratio of the acoustic impedances of the piezoelectric layer and the diamond layer is less than about 2. In some embodiments of the invention, the ratio of the acoustic impedances of the piezoelectric layer and the diamond layer is about 1. As a result, only a small portion of the acoustic energy is reflected by the interface between the diamond layer and the piezoelectric layer, so that the diamond layer and the piezoelectric layer oscillate substantially in phase but are acoustically isolated from the second substrate.

In some embodiments of the invention, any of the diamond layers, the diamond substrate or a part of the diamond layer may comprise a dopant. This dopant allows the diamond layer to be used as a buried electrode. During the operation of the electroacoustic resonator, this electrode may be coupled to at least one terminal contact allowing to keep the electrode on a pre-determinable potential. In some embodiments, this potential may be selected to be a ground potential. In other embodiments of the invention, the diamond layer may be electrically insulated from its surrounding, thereby creating a floating potential of the diamond.

In some embodiments of the invention, the entire diamond layer may be doped by at least one dopant. In other embodiments of the invention, only a part of the diamond layer may be doped by at least one dopant. By way of example, the diamond layer may be doped in its upper region adjacent to the first side within a depth selected from 100 nm to 500 nm. In some embodiments, the diamond layer may be doped at least in a region that is in contact with the piezoelectric layer. These embodiments of the invention may have sufficient doping for a functional, lower electrical contact for the piezoelectric layer.

In some embodiments of the invention, the diamond layer may be doped with boron or phosphorus. As a result, either a p-doping or an n-doping may be manufactured.

In some embodiments of the invention, a polymer layer having a first side and an opposite second side may be arranged between the first side of the diamond layer and the second side of the second substrate. In some embodiments, such a polymer layer may provide adhesive forces required for the wafer bonding process between the second substrate and the diamond layer. In some embodiments, the material of the polymer layer may be selected to have a lower acoustic impedance than the second substrate, so that a higher portion of the acoustic energy may be reflected at the interface. In some embodiments, the polymer layer may fill the surface roughness of the first side of the diamond layer so that time-consuming polishing of the diamond layer is not necessary in these embodiments and the manufacture of the resonator according to the invention may be simplified.

In some embodiments of the invention, the polymer layer may contain a thermosetting resin. In some embodiments of the invention, the polymer layer may contain or consist of benzocyclobutene. In some embodiments of the invention, the polymer layer may also comprise other hydrocarbon-based polymers. Such a polymer layer can be applied by spin coating in a desired layer thickness.

In some embodiments of the invention, the polymer layer may have an acoustic impedance being selected from about $0.05 \cdot 10^7$ kg·s$^{-1}$·m$^{-2}$ to about $0.5 \cdot 10^7$ kg·s$^{-1}$·m$^{-2}$. In the present description, the word "about" means that the stated value can vary within a range of +/−5%. In these embodiments, the acoustic impedance of the polymer layer is substantially lower than the acoustic impedance of the diamond layer, so that a sufficient portion of the acoustic energy is reflected at the interface between polymer and diamond to provide the desired high Q-factor. "Sufficient" means more than 85% or more than 90% up to 100% reflected energy and less than 15% or less than 10% or close to nothing coupled into the substrate.

In some embodiments of the invention, the polymer layer may have a thickness being selected from about 1 µm to about 10 µm. Such a polymer layer ensures sufficient acoustic decoupling from the second substrate and allows for a secure connection of even rough diamond surfaces to the second substrate.

In some embodiments of the invention, the electroacoustic resonator comprises an interdigital transducer on the first side of the piezoelectric layer. Such an interdigital transducer (IDT) comprises in some embodiments at least one comb-shaped structure. Such an interdigital transducer comprises in other embodiments at least two comb-shaped structure, with the teeth or fingers of one structure engaging in the intermediate spaces of the opposing structure. Such an interdigital transducer may be manufactured from a structured layer made from a metal or an alloy. Such an interdigital transducer allows applying electric fields in the piezoelectric layer. In the case of alternating fields, the piezoelectric layer is forced to oscillations which propagate as acoustic waves inside the diamond layer. Due to the strong bonding forces of the sp3-hybridized carbon atoms in the diamond lattice, the diamond layer shows a relatively high sound velocity, which may allow for a higher operating frequency of such an electroacoustic resonator.

In some embodiments of the invention, a Bragg reflector may be arranged on the first side of the piezoelectric layer. A Bragg reflector of this type may confine the acoustic wave propagating inside the diamond layer to a predefined partial volume of the diamond layer, thereby improving the Q-factor.

In some embodiments of the invention, a layer comprising $SiO_2$ may be deposited on top of the piezoelectric layer and/or on top of the interdigital transducer of the electroacoustic resonator. Such a $SiO_2$ layer may cover the active area of the resonator. IDT or Bragg reflector structures may be formed within the $SiO_2$ layer. The thickness of the oxide layer may range e.g. from about 10 nm to several µm. The $SiO_2$ layer may have several functions in different embodiments of the invention such as the passivation of the piezoelectric surface, the tuning of the resonator frequency and/or the reduction of the temperature coefficient of frequency (TCF).

In some embodiments of the invention, the diamond layer may have a thickness of about 1 µm to about 30 µm. In other embodiments of the invention, the diamond layer may have a thickness of about 2 µm to about 20 µm. In still other embodiments of the invention, the diamond layer may have a thickness of about 2 µm to about 10 µm. In some embodiments of the invention, the diamond layer may have a thickness of about 3 µm to about 8 µm. In other embodiments of the invention, the diamond layer may have a thickness of about 8 µm to about 25 µm.

In some embodiments of the invention, the diamond layer may have a thickness of about 10 µm to about 30 µm. Due to the mechanical stabilization by the second substrate, the diamond layer may be thinner in some embodiments of the invention than in known electroacoustic resonators, so that the resonator according to the invention may be manufactured in a more cost-effective and easier way. In other embodiments of the invention, the diamond layer allows improved heat management. This may result in any of a higher load capacity or a reduction in the temperature coefficient of the frequency.

In some embodiments of the invention, the diamond layer may comprise an electrode to be connected to a ground potential during operation of the electroacoustic resonator. In some embodiments of the invention, the diamond layer may be arranged so as to be electrically insulated.

In some embodiments of the invention, an acoustic layer thickness d, the sound velocity c, the operating frequency f and the period λ of the interdigital transducer may be correlated to each other as follows:

$$f*d = \frac{cd}{\lambda} << 5 \text{ MHz mm.}$$

Under these conditions, Lamb waves may be generated which, in contrast to other surface waves, may have a higher frequency and/or a higher Q-factor. Thus, the electroacoustic resonator according to the invention may allow for reliable operation at higher frequencies, thereby enabling reliable channel separation in telecommunication systems.

Figure 1:
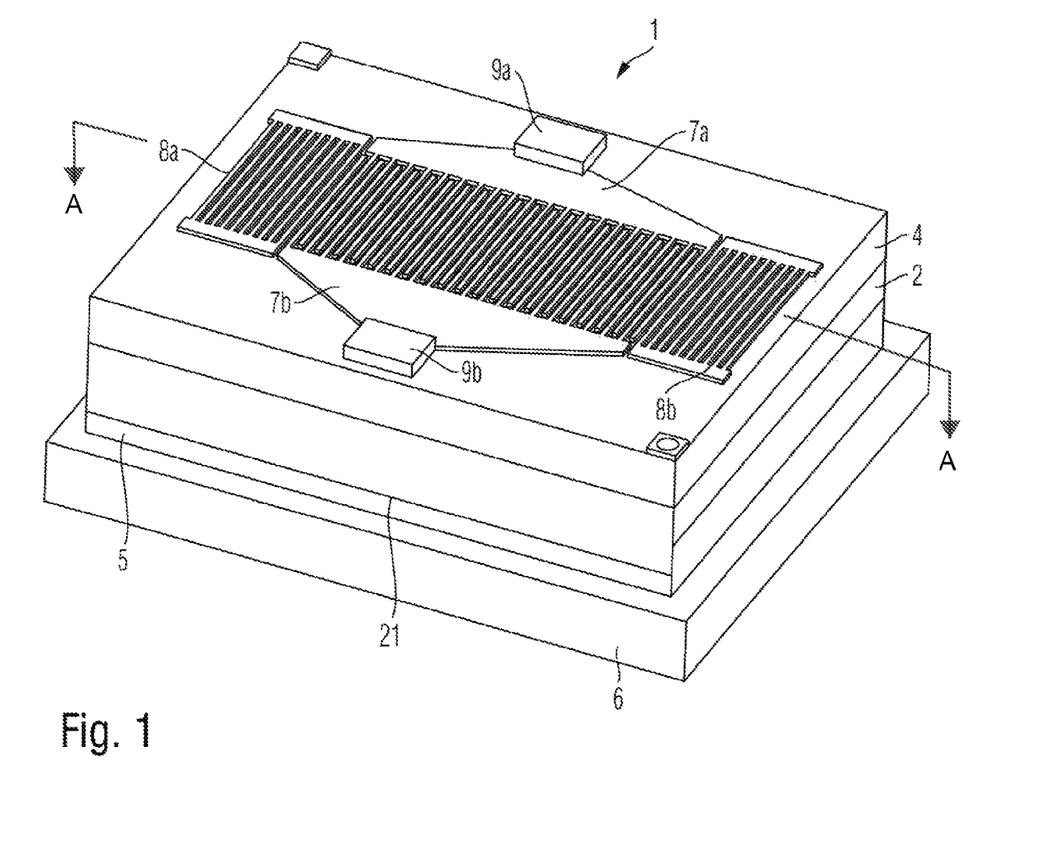
FIG. 1 illustrates a perspective view of an electroacoustic resonator according to the invention.
Figure 2:
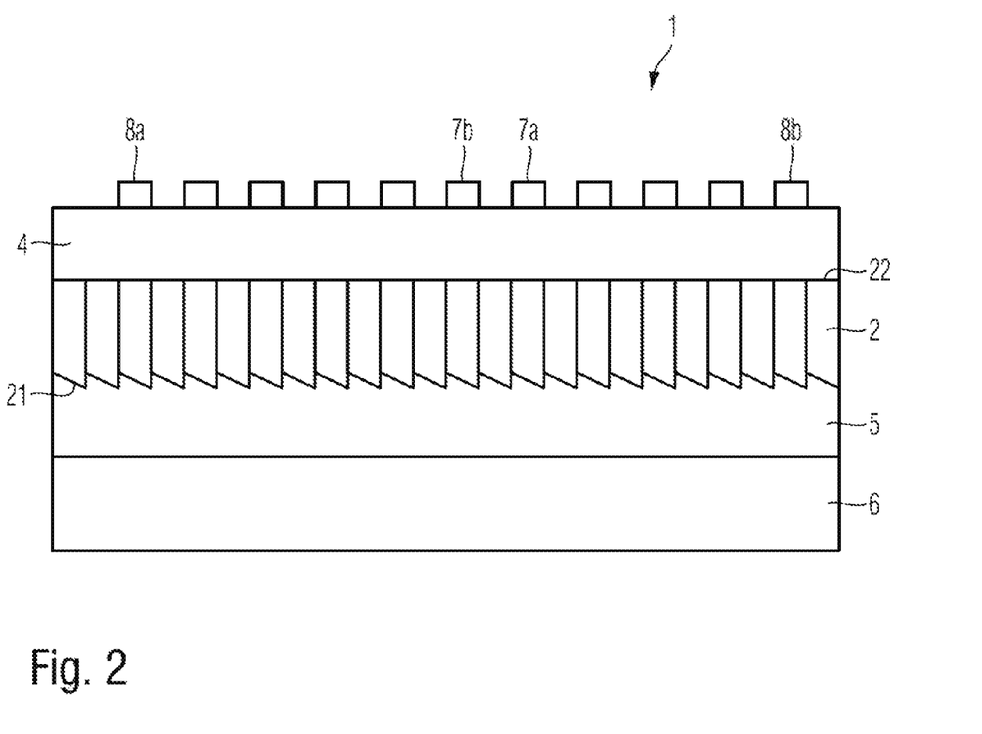
FIG. 2 illustrates an enlarged schematic cross-sectional representation of a center portion of the resonator of FIG. 1 according to aspects of the disclosure.

Returning now to the figures, FIGS. 1 and 2 illustrate a first embodiment of an electroacoustic resonator according to the invention. FIG. 1 is a perspective view of a representative embodiment of an electroacoustic resonator 1 according to aspects of the disclosure. FIG. 2 is an enlarged cross-sectional schematic representation of a center portion of the resonator taken along line A-A of FIG. 1.

The electroacoustic resonator 1 comprises a diamond layer 2. The diamond layer 2 has a first side 21 and an opposite second side 22. The diamond layer 2 may be deposited on a first substrate as a quasi-monocrystalline, monocrystalline, polycrystalline or nanocrystalline diamond layer from a carbon-based gas phase. Said first substrate is put into a vacuum chamber which subsequently will be evacuated and back-filled with a precursor gas mixture comprising at least hydrogen and a carbon-based gas, such as methane, ethane or acetylene. This gas phase is activated by microwave radiation or hot filaments made from a refractory metal so that the molecules of the precursor gas dissociate and the carbon is deposited in $sp^3$ hybridization in a diamond lattice on the first side of the first substrate kept at an elevated temperature. The second side 22 of the diamond layer 2 that is located adjacent to the first side of the first substrate is comparatively smooth. The first side 21 of diamond layer 2 that faces the gas phase may have a higher roughness due to lattice defects. The diamond layer 2 manufactured in this way may have a thickness ranging from about 2 µm to about 20 µm.

As may also be seen from FIG. 1 and FIG. 2, the first substrate is completely removed after manufacturing of the diamond layer 2. A piezoelectric layer 4 with a thickness ranging from about 0.1 µm to about 5 µm or ranging from about 0.5 µm to about 1.5 µm is deposited on the second side 22 of the free-standing diamond layer 2 obtained in the method step performed previously. The piezoelectric layer 4 may comprise any of AlN, AlScN or ZnO. The piezoelectric layer 4 may be deposited using any of a sputter deposition, MOCVD, MBE or MOVPE process.

At least one interdigital transducer 7 is manufactured on the piezoelectric layer 4 by depositing a layer of a metal or an alloy and subsequently structuring said layer by masking with a photoresist, structure said mask and partially remove the metal by wet or dry chemical etching. The interdigital transducer shown comprises two comb-shaped structures 7a and 7b, with the teeth or fingers of one structure 7a engaging in the intermediate spaces of the opposing structure 7b and vice versa. Such an interdigital transducer 7 allows applying electric fields in the piezoelectric layer. In the case of alternating fields, the piezoelectric layer is forced to oscillations which propagate as acoustic waves inside the diamond layer.

In other embodiments, the individual structures 7a and 7b of the interdigital transducer are manufactured from a metal or an alloy which is deposited on a masking layer so that excess metal may be removed by means of a lift-off process to obtain the structure visible in FIGS. 1 and 2.

In order to facilitate the electrical contacting of the interdigital transducer 7, structures 7a and 7b each have a respective optional terminal contact 9a and 9b. These contacts may also comprise a metal or an alloy and, due to their greater thickness, may be more sturdy and resistant compared to the structures 7a and 7b. This feature allows reliable contacting of the interdigital transducer 7, e.g. by a solder connection or bonding wires.

Furthermore, an optional Bragg reflector 8 is shown in the drawings. In the illustrated embodiment, Bragg reflectors 8a and 8b are located in longitudinal direction on both sides of the resonator formed by the diamond layer. The diamond layer 2 and the piezoelectric layer 4 form the resonator 5 which is decoupled from the substrate 6 by the bonding polymer 5 in a direction corresponding to the depth of the electroacoustic resonator 1. The Bragg reflectors 8a and 8b comprise an approximately grid-like metallization covering a partial surface of the first side of the piezoelectric layer 4 as well. Acoustic waves propagating in the diamond layer 2 or the piezoelectric layer 4 are reflected by the Bragg reflectors 8a and 8b, so that the oscillation energy is confined in the electroacoustic resonator.

As can be best seen in FIG. 2, the diamond layer 2 is fixed to a second substrate 6. This attachment may be achieved by means of a bonding polymer 5 in a wafer bonding process. The polymer 5 may have a thickness ranging from about 1 μm to about 10 μm. As a result, the polymer 5 may compensate for the roughness of the first side 21 of the diamond layer 2, so that time-consuming polishing of the diamond layer 2 is not necessary which will simplify production.

The acoustic impedance, i.e. the product of the density and sound velocity in the diamond layer 2 and the piezoelectric layer 4, is approximately equal, so that acoustic waves propagate uniformly within the two layers and are reflected only to a small extent at the interface between the diamond layer 2 and the piezoelectric layer 4. In contrast, the acoustic impedance of the polymer layer 5 is lower than the acoustic impedance of the diamond layer 2 by at least a factor of 5. As a result, acoustic waves propagating in the diamond layer 2 are reflected at the first side 21 of the diamond layer to a large extent and only a small portion of the oscillation energy couples into the polymer layer 5 and the second substrate 6. As energy loss towards the second substrate is minimized, the acoustic energy density inside the diamond layer 2 and the piezoelectric layer 4 may increase, which contributes to improved properties of the electroacoustic resonator according to the invention.

Figure 3:
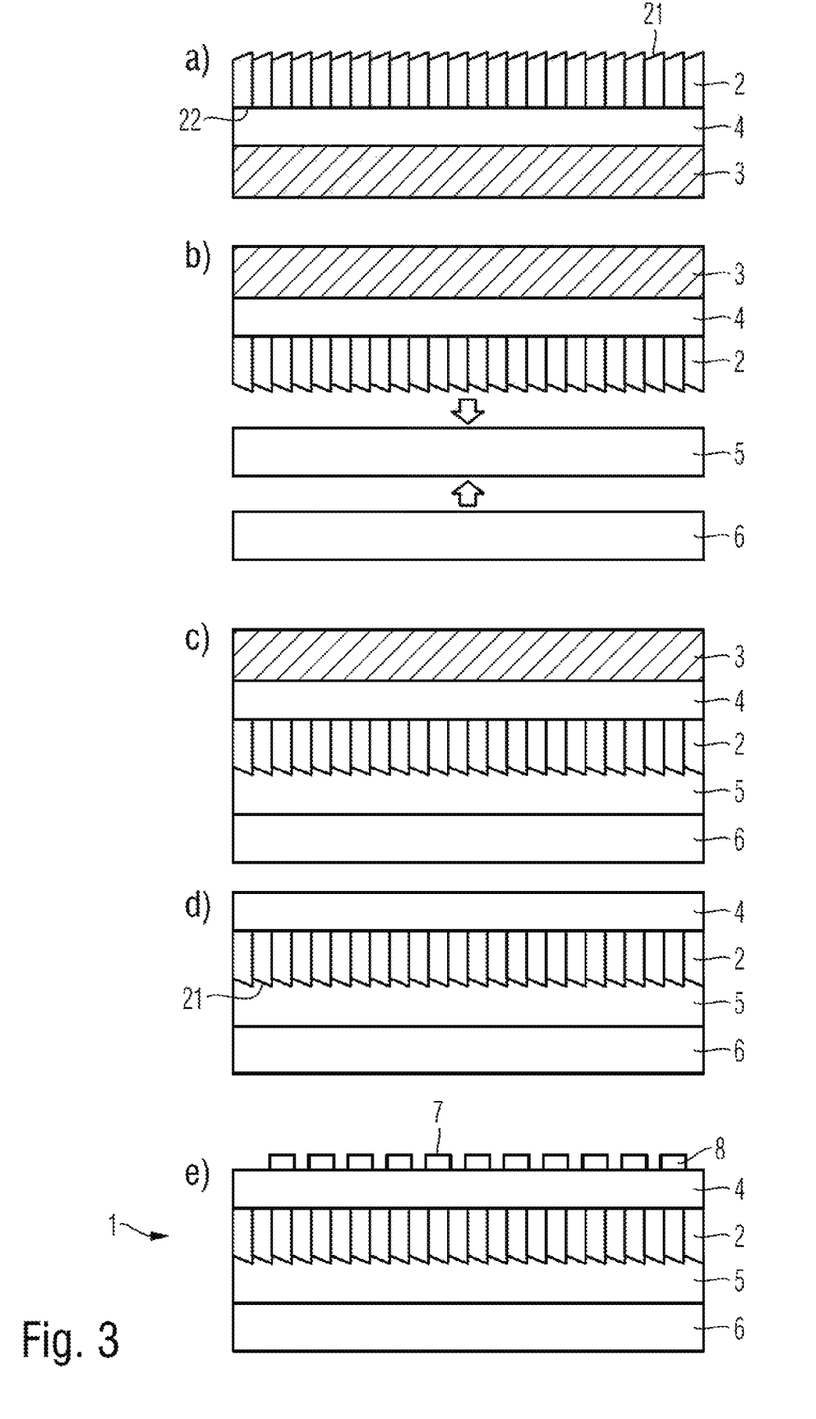
FIG. 3 illustrates a first embodiment of a manufacturing method of the electroacoustic resonator.
Figure 4:
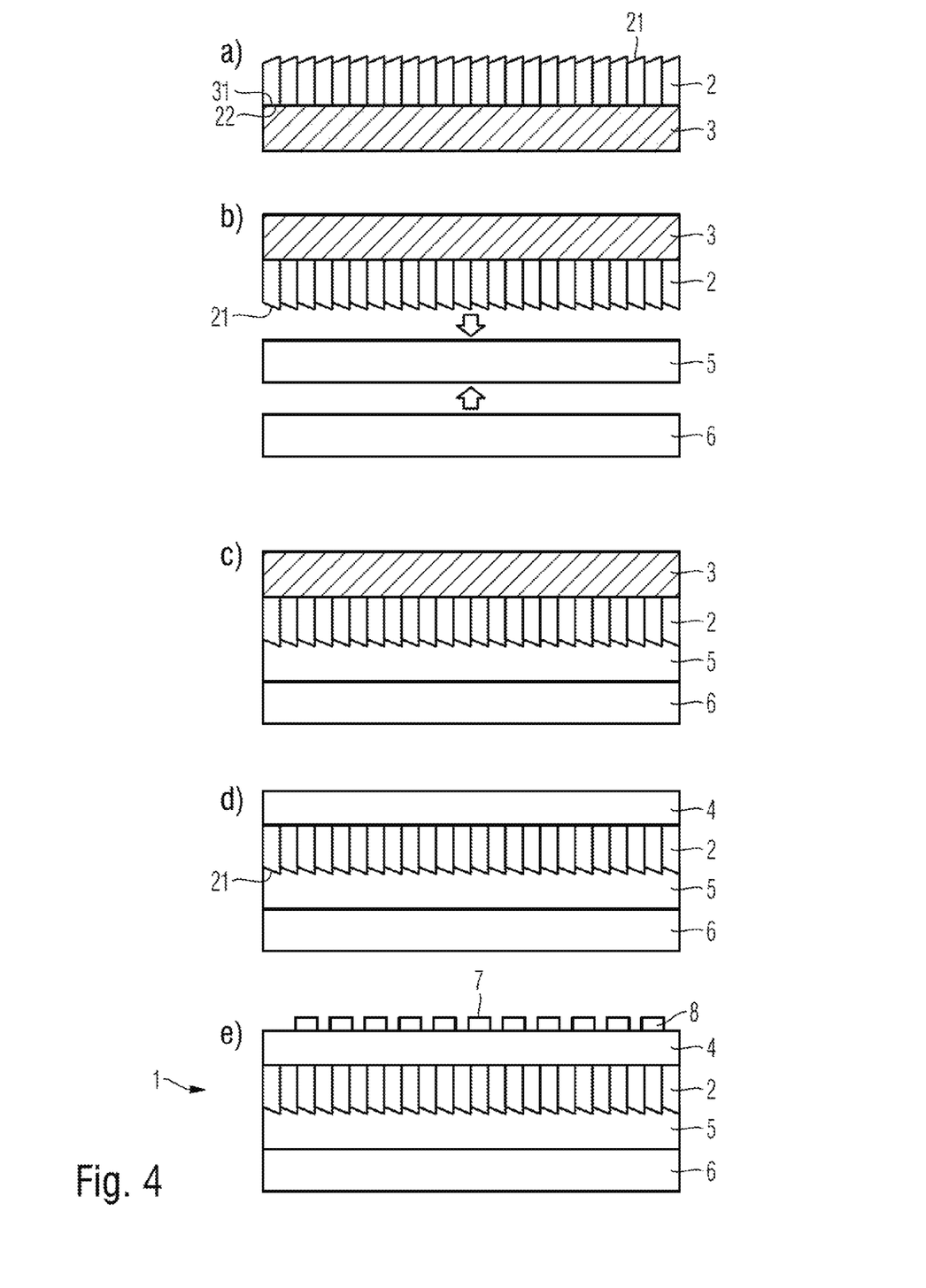
FIG. 4 illustrates a second embodiment of the manufacturing method of the electroacoustic resonator.

FIGS. 3 and 4 are used to explain two different manufacturing processes. Like features are provided with like reference signs, so that the following description may be kept somewhat more concise.

FIG. 3a shows a semi-finished product after the first manufacturing steps of an acoustic resonator according to the invention. A first substrate 3 is shown, which for example contains silicon, a ceramic such as aluminum oxide ($Al_2O_3$), silicon oxide ($SiO_2$), silicon nitride ($Si_3N_4$) or silicon oxynitride ($Si_2N_2O$) or a metal, in particular a refractory metal.

A piezoelectric layer 4 is deposited on one side of said first substrate 3. The layer thickness may be selected to range from about 1 μm to about 5 μm or from about 1 μm and about 10 μm. The piezoelectric layer 4 may be deposited by means of sputter deposition. However, it should be clear that the invention is not limited to that specific deposition technique.

In the next method step, a diamond layer 2 is deposited on the piezoelectric layer 4. Said diamond layer 2 is deposited by a chemical vapor deposition (CVD) process as described above. The second side 22 of the diamond layer 2 is arranged adjacent to the first side of the piezoelectric layer 4. Since the piezoelectric layer 4 is comparatively smooth, the second side 22 of the diamond layer 2 is smooth as well. The first side 21 of the diamond layer 2 facing the gas phase, on the other hand, may have a greater roughness.

FIG. 3b illustrates a second method step. As may be seen from FIG. 3b, the semi-finished product obtained in the previous method steps is fixed to a second substrate 6 by means of a polymer layer 5. For this purpose, a wafer bonding process may be used. The polymer used for this purpose may contain or consist of benzocyclobutene.

After the wafer bonding as explained above, a semi-finished product is obtained, which is depicted in FIG. 3c. The bond between the first side 21 of the diamond layer 2 and the first side of the second substrate 6 is illustrated in FIG. 3c. Due to the polymer layer 5, which fills the roughness of the first side 21 of the diamond layer 2, time consuming polishing of the first side 21 of the diamond layer 2 may be omitted.

FIG. 3d illustrates the removal of the first substrate 3. Removal of the first substrate 3 may be done by a mechanical process, such as grinding, milling or polishing. In other embodiments of the invention, the first substrate 3 may be removed by wet or dry chemical etching. In some embodiments, parts of the piezoelectric layer 4 may be removed as well, thereby bringing the piezoelectric layer 4 to its target thickness. This thickness may range from about 0.9 μm to about 1.1 μm.

Finally, FIG. 3e shows the deposition of a metal layer having a layer thickness of about 0.1 μm to about 1 μm. Deposition may be done by evaporation or sputtering. After deposition, said metal layer is structured to obtain two Bragg reflectors 8 and the interdigital structure 7, by means of which an electric field may be applied to the piezoelectric layer 4 during operation of the electroacoustic resonator.

FIG. 4 illustrates an alternative manufacturing process. As shown in FIG. 4a, the manufacturing process starts with the provision of a first substrate 3, which may comprise silicon, a metal, diamond or strontium titanate. A diamond layer 2 having the desired layer thickness is then deposited thereon by a CVD process as explained above.

Subsequently, the side 21 of the diamond layer 2 with the first substrate 3 attached is fixed to a second substrate 6 using a wafer bonding process. This method step is shown in FIG. 4b. The cross-section of the semi-finished product obtained is shown in FIG. 4c.

As shown in FIG. 4d, the first substrate 3 is subsequently removed by any of wet or dry chemical etching or mechanical treatment as described above. After completion of this method step, the second side 22 of the diamond layer 2 is exposed.

Finally, a piezoelectric layer 4 is deposited on the second side 22 of the diamond layer 2 by sputtering, evaporation, MOCVD, MBE or another thin film deposition technique.

FIG. 4e illustrates the manufacture of the interdigital transducer 5 and the optional Bragg reflector 8 on the surface of the piezoelectric layer 4 by metallization and subsequent structuring of the metal layer.

While the disclosure has been described in this detailed description, the same is to be considered as exemplary and not restrictive in character, it being understood that only illustrative embodiments thereof have been described and that changes and modifications that come within the spirit of the disclosure are desired to be protected. If the claims and the above description define "first" and "second" features, this designation is used to distinguish between two similar features without determining a ranking. The following claims are to be understood in such a way that a stated feature is present in at least one embodiment of the invention. This does not exclude the presence of additional features.

The invention claimed is:

1. A method for manufacturing an electroacoustic resonator comprising the steps of:

providing a first substrate having a first side and an opposite second side;

depositing a diamond layer having a first side and an opposite second side on said first substrate, wherein the second side of the diamond layer is in contact with said first side of the first substrate;

removing the first substrate;

forming a piezoelectric layer on the second side of the diamond layer;

applying a second substrate to the first side of the diamond layer; and depositing a polymer layer between the first side of the diamond layer and the second substrate.

2. The method according to claim 1, wherein the polymer layer comprises benzocyclobutene.

3. The method according to claim 1, wherein the polymer layer has a thickness being selected from 1 μm to 10 μm.

4. The method according to claim 1, comprising further the step of manufacturing an interdigital transducer on the first side of the piezoelectric layer.

5. The method according to claim 1, comprising further the step of manufacturing a Bragg reflector on the first side of the piezoelectric layer.

6. The method according to claim 1, comprising further depositing a layer comprising of $SiO_2$ deposited on top of the piezoelectric layer or on top of the interdigital transducer of the electroacoustic resonator.

7. A method for manufacturing an electroacoustic resonator comprising the steps of:

providing a first substrate having a first side and an opposite second side;

depositing a piezoelectric layer having a first side and an opposite second side on the first side of said first substrate, such that the second side of said piezoelectric layer is in contact with said first side of the first substrate;

depositing a diamond layer having a first side and an opposite second side on the first side of said piezoelectric layer, such that the second side of said diamond layer is in contact with said first side of the piezoelectric layer;

applying a second substrate having a first side and an opposite second side on the first side of the diamond layer such that the second side of said second substrate faces said first side of the diamond layer;

depositing a polymer layer having a first side and an opposite second side between the first side of the diamond layer and the second side of the second substrate; and removing the first substrate.

8. The method according to claim 7, wherein the polymer layer comprises benzocyclobutene.

9. The method according to claim 7, wherein the polymer layer has an acoustic impedance being selected from $0.05 \cdot 10^7$ kg·s$^{-1}$·m$^{-2}$ to $0.5 \cdot 10^7$ kg·s$^{-1}$·m$^{-2}$.

10. The method according to claim 7, comprising further the step of manufacturing an interdigital transducer on the first side of the piezoelectric layer.

11. The method according to claim 7, comprising further the step of manufacturing a Bragg reflector on the first side of the piezoelectric layer.

12. An electroacoustic resonator comprising a diamond layer having a first side and an opposite second side;

a piezoelectric layer having a first side and an opposite second side, wherein the second side of said diamond layer is in contact with said first side of the piezoelectric layer;

a polymer layer having a first side and an opposite second side;

a second substrate having a first side and an opposite second side, wherein the first side of the diamond layer is in contact with the second side of the polymer layer and the first side of they polymer layer is in contact with the second side of the second substrate.

13. The electroacoustic resonator according to claim 12, wherein the diamond contains at least one dopant being selected from the group consisting of boron and phosphorus.

14. The electroacoustic resonator according to claim 12, wherein the polymer layer comprises benzocyclobutene.

15. The electroacoustic resonator according to claim 12, wherein the polymer layer has an acoustic impedance being selected from about $0.05 \cdot 10^7$ kg·s$^{-1}$·m$^{-2}$ to about $0.5 \cdot 10^7$ kg·s$^{-1}$·m$^{-2}$.

16. The electroacoustic resonator according to claim 12, wherein the polymer layer has a thickness being selected from about 1 μm to about 10 μm.

17. The electroacoustic resonator according to claim 12, comprising further an interdigital transducer being arranged on the second side of the piezoelectric layer.

18. The electroacoustic resonator according to claim 12, comprising further a Bragg reflector being arranged on the second side of the piezoelectric layer.

19. The electroacoustic resonator according to claim 12, wherein the diamond layer has a thickness of 1 μm to 30 μm.

20. The electroacoustic resonator according to claim 12, wherein the diamond layer is connected to ground potential during the operation of the electroacoustic resonator, or in that the diamond layer is electrically insulated.

21. The electroacoustic resonator according to claim 17, wherein the thickness d of the diamond layer, the velocity of sound c of the diamond layer, the operating frequency f of the electroacoustic resonator and the period λ of the interdigital transducer are correlated as follows:

$$f * d = \frac{cd}{\lambda} << 5 \text{ MHz mm.}$$

* * * * *